(12) United States Patent
Bang et al.

(10) Patent No.: US 7,841,582 B2
(45) Date of Patent: Nov. 30, 2010

(54) VARIABLE SEAL PRESSURE SLIT VALVE DOORS FOR SEMICONDUCTOR MANUFACTURING EQUIPMENT

(75) Inventors: Won B. Bang, Santa Clara, CA (US); Toan Q. Tran, San Jose, CA (US); Yen-Kun Victor Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1540 days.

(21) Appl. No.: 10/990,125

(22) Filed: Nov. 16, 2004

(65) Prior Publication Data

US 2005/0269334 A1    Dec. 8, 2005

Related U.S. Application Data

(60) Provisional application No. 60/576,737, filed on Jun. 2, 2004.

(51) Int. Cl.
*F16K 25/00* (2006.01)

(52) U.S. Cl. .................. 251/175; 251/30.02; 251/94; 220/240

(58) Field of Classification Search .............. 220/581, 220/203.01, 203.02, 239, 203.13, 240; 251/94, 251/30.02, 30.05, 73, 175

See application file for complete search history.

(56) References Cited

U.S. PATENT DOCUMENTS

| | | | |
|---|---|---|---|
| 6,347,918 B1 * | 2/2002 | Blahnik | 414/217 |
| 6,647,665 B1 | 11/2003 | Tabrizi et al. | |
| 6,647,918 B1 | 11/2003 | Welch et al. | |
| 6,905,107 B2 * | 6/2005 | Blahnik | 251/195 |
| 7,007,919 B2 * | 3/2006 | Blonigan et al. | 251/113 |
| 2004/0206921 A1 * | 10/2004 | Blonigan et al. | 251/113 |
| 2004/0247787 A1 * | 12/2004 | Mackie et al. | 427/248.1 |

* cited by examiner

*Primary Examiner*—Anthony Stashick
*Assistant Examiner*—Christopher B McKinley
(74) *Attorney, Agent, or Firm*—Townsend and Townsend and Crew

(57) ABSTRACT

Techniques for a door system for sealing an opening between two chambers in a semiconductor processing system are described. A sealing member seals the opening when a door is in a closed position. To selectively open and close the opening, an actuator moves the door. A valve actuator switch provides a first or second pressure to the actuator depending on the pressure inside a first chamber. In one embodiment, a sensor monitors the pressure inside the first chamber.

14 Claims, 6 Drawing Sheets

VARIABLE SEAL PRESSURE SLIT VALVE DOORS FOR SEMICONDUCTOR MANUFACTURING EQUIPMENT

CROSS-REFERENCES TO RELATED APPLICATIONS

The present application claims the benefit of U.S. provisional patent application 60/576,737, filed Jun. 2, 2004, entitled "Variable Seal Pressure Slit Valve Doors for Semiconductor Manufacturing Equipment," which is incorporated by reference.

BACKGROUND OF THE INVENTION

The present invention generally relates to the construction of vacuum processing chambers used for processing substrates, and more specifically to techniques for variable seal pressure slit valve doors.

In general, vacuum processing chambers for processing substrates include a substrate transfer opening, commonly known as a slit valve. A slit opening, a tunnel-like passage associated with the slit valve, is used to transfer substrates between a process chamber, also called a reactor chamber, and a transfer chamber. The slit valve opening is commonly sealed at an outside surface of the process chamber body by a blocking plate which moves over the slit valve opening. This blocking plate is a conventional slit valve door. A perfluoro elastomeric o-ring is generally attached to the conventional slit valve door to provide a seal.

During processing, a high slit valve door sealing pressure is applied, typically about 80 psi to 90 psi, due to a large pressure gradient between the process and transfer chambers. High pressure, in the range of about 10 to 760 torr, is often used in a process chamber to enhance the process being performed, such as during wafer film deposition. Meanwhile, the transfer chamber is usually kept at 0.3 torr. The high sealing pressure introduces a tensile stress on the exposed surface of the tightly compressed o-ring.

During a chamber cleaning process, the process chamber is usually at a much lower pressure, in the range of about 1 to 4 torr. The slit door, including the o-ring, is exposed to cleaning gases. These cleaning gases, such as fluorine, attack the chemical composition of the o-ring causing the formation of particle contaminants. These particles can contaminate the process chamber and damage substrates.

Until now there has been no satisfactory solution to overcome o-ring contaminants for a slit valve door due to chemical attack, in that conventional vacuum processing chambers are constructed in a configuration that gives rise to particles from 0-rings in the process chamber.

BRIEF SUMMARY OF THE INVENTION

The present invention recognizes that the severity of the chemical attack on the exposed surface of o-ring is dependent on the level of tensile (or shear) stress experienced. Embodiments of the present invention provide techniques for a door system for sealing an opening between two chambers in a semiconductor processing system. The sealing pressure is adjusted to reduce the stress on the sealing member for the slit valve door. In this way, the chemical attack on the sealing member is reduced. Consequently, degradation of the sealing member is diminished and particle contamination is decreased.

According to an embodiment of the present invention, the door system for sealing an opening between two chambers in a semiconductor processing system includes a door, sealing member, actuator, and valve actuator switch. The sealing member seals the opening when the door is in a closed position. To selectively open and close the opening, the actuator moves the door. The valve actuator switch provides a first or second pneumatic pressure to the actuator depending on a pressure inside a chamber.

According to an another embodiment, a method for sealing an opening between two chambers in a semiconductor processing device includes providing a slit door having an o-ring mounted along edges of the slit door. The opening is closed with the slit door. In the closed position, the opening is sealed with the o-ring by applying pressure to the slit door. The pressure applied to the slit door in the closed position depends on a pressure gradient between the two chambers.

In yet another embodiment, a method for sealing an opening between two regions in a semiconductor processing device is provided. During forming a film on a substrate position in a first region of the two regions, a first sealing pressure on a door is applied. Next, during cleaning of the first region, a second sealing pressure on the door is applied. The first sealing pressure is greater than the second sealing pressure.

The foregoing, together with other features, embodiments, advantages of the present invention, will become more apparent when referring to the following specification, claims, and accompanying drawings.

DETAILED DESCRIPTION OF THE INVENTION

Embodiments of the present invention provide techniques for a door system for sealing an opening between two chambers in a semiconductor processing system and, more particularly, techniques to substantially reduce particle contaminants from a slit valve o-ring due to a chamber cleaning process. The inventors recognize that slit valve o-rings, generally perfluoro elastomers, are chemically attacked more severely when under tensile (or shear) stress by the chemical species used during the chamber cleaning process, such as fluorine and nitrogen trifluoride (NF3). Accordingly, the present approach decouples the slit valve sealing pressure during the chamber cleaning process from the deposition process. Since the pressure is lower in the process chamber during the cleaning process, the slit valve sealing pressure can be lower during the chamber cleaning process than the deposition process. Slit valve sealing process is dependent on the pressure gradient between the transfer and process chambers to ensure maintenance of a proper seal.

Figure 1:
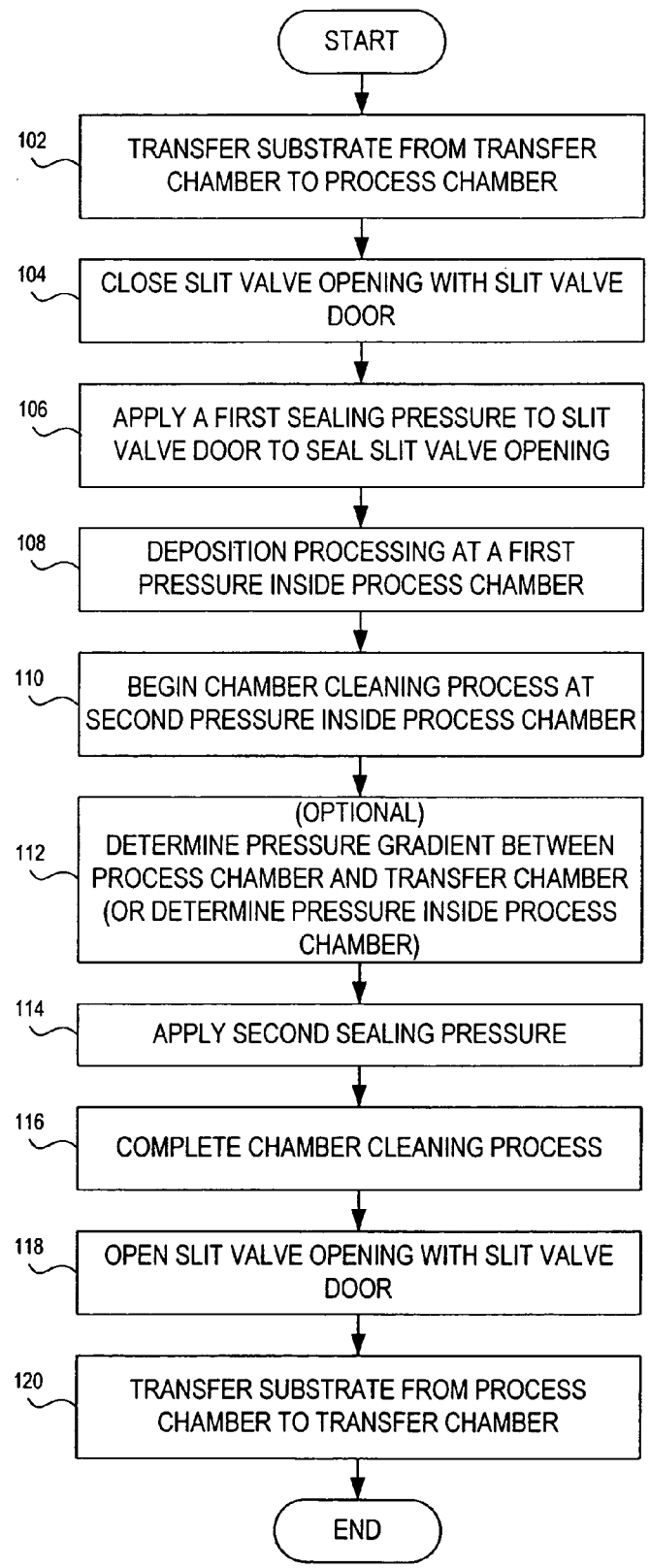
FIG. 1 shows a simplified flow diagram of sealing a slit valve opening between two chambers in a vacuum processing chamber system according to an embodiment of the invention.

FIG. 1 shows a simplified flow diagram of sealing a slit valve opening between two chambers in a vacuum processing chamber system according to an embodiment of the invention. In steps 102 and 104, a semiconductor substrate is positioned in the process chamber and a slit valve door is closed. Next, as shown in step 106, a first sealing pressure is applied to the slit valve door to seal the slit valve opening. Once the process chamber is sealed from the transfer chamber, deposition processing on the substrate can begin. During the deposition process, the process chamber is at a first pressure, which is generally much greater than the pressure in the transfer chamber.

After completion of the deposition process, a chamber cleaning process commences in step 110. The pressure in the process chamber during the chamber cleaning process is generally lower than the pressure during the deposition process. In step 114, a second sealing pressure is applied to the slit valve door to maintain the seal. According to an embodiment of the present invention, the second sealing pressure can be lower than the first sealing pressure. After completion of the chamber cleaning process in step 116, the slit valve door can be opened and the processed substrate can be removed from the process chamber as shown in steps 118 and 120. In another embodiment of the present invention, as shown in step 112, the pressure gradient between the process chamber and transfer chamber can be determined or, alternatively, the pressure inside the process chamber can be determined. This information can be used to apply the appropriate second sealing pressure in step 114.

Although the steps above are listed in a specific order, the steps may take place in any order, as desired and depending on the specific application. These are general steps that may be applied to processing a semiconductor substrate. There may be additional or other steps, which may replace one or more above steps. Certain steps may be repeated. For example, the determine pressure gradient step may be done periodically at any division of time (e.g., every second, minute, hour, or day) or continuously during substrate processing.

Figure 2:
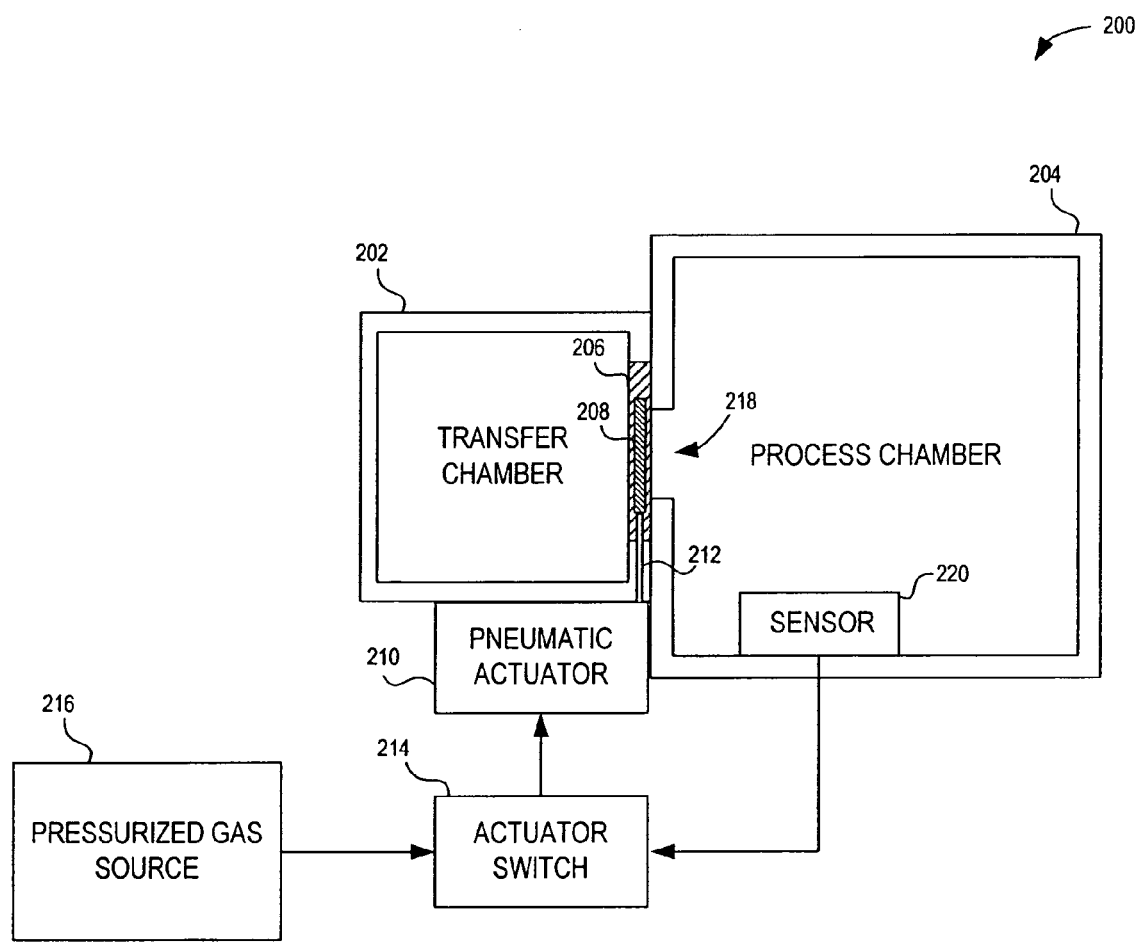
FIG. 2 is a simplified block diagram illustrating an exemplary vacuum processing chamber system according to an embodiment of the present invention.

FIG. 2 is a simplified block diagram illustrating an exemplary vacuum processing chamber system 200 according to an embodiment of the present invention. Transfer chamber 202 is connected to process chamber 204 through a slit valve 206 and slit valve opening 218.

Slit valve 206 has a slit valve door 208 movable in a direction generally parallel to the plane of the slit valve opening 218. Rods 212 connect slit valve door 208 to the pneumatic actuator 210. In order to move rods 212, and thus slit valve door 208, the pneumatic actuator 210 applies or relaxes sealing pressure to rods 212.

Pressurized gas is provided to pneumatic actuator 210 from actuator switch 214. Actuator switch 214 can supply pneumatic actuator 210 with either a first or second pressure level. The first pressure level provides sufficient slit valve sealing pressure to seal the slit valve opening 218 when a high pressure gradient exists between the transfer chamber 202 and the process chamber 204. This pressure gradient can be up to about 600 torr to about 760 torr during deposition processing of substrates. In order to provide proper seal under such conditions, the first pressure level can exceed 45 psi. In one embodiment, the first pressure level is the pressure supplied by pressurized gas source 216.

The second pressure provided by actuator switch 214 is lower, and in some embodiments substantially lower, than the first pressure level. The second pressure level provides sufficient slit valve sealing pressure to seal the slit valve opening 218 when a lower pressure gradient exists between the transfer chamber 202 and the process chamber 204. During the chamber cleaning process, this pressure gradient can be in the range of about 3 torr to about 10 torr. Under these conditions, the second pressure level can be about 20 psi, 10 psi, 5 psi, or even smaller.

In alternative embodiments, actuator switch 214 can supply gas to pneumatic actuator 210 at a plurality of pressure levels, for example, three, four, five, or more pressure levels. In this way, a closer minimum pressure level capable of sealing the slit valve opening 218 of the plurality of pressure levels for pressure gradient can be supplied to pneumatic actuator 210.

Pressurized gas source 216 supplies actuator switch 214 with pressurized gas. The pressure level supplied by the pressurized gas source 216 is at least the maximum pressure level needed by vacuum processing chamber system 200, such as at least 45 psi. Pressurized gas source 216 can typically provide gas at about 80 psi to about 90 psi since semiconductor fabrication facilities generally provide pressurized gas lines operating at about 80 psi to about 90 psi.

In the specific embodiment of FIG. 2, sensor 220 is provided to measure the pressure inside process chamber 204. Sensor 220 can send a signal when a preset pressure threshold is detected to actuator switch 214. This signal can be pneumatic or electrical, and analog or digital. The actuator switch 214 then adjusts the sealing pressure level based on the information provided by the sensor 220. Alternatively, sensor 220 can transmit real-time data representing the measured pressure to actuator switch 214. Data transmission can be continuous or made at discrete intervals, such as every second, minute, or hour. In an alternative embodiment, sensor 220 can measure other environmental parameters inside process chamber 204, such as humidity, temperature, or chemical environment, to determine whether the process chamber 204 is being used for deposition processing or chamber cleaning. For example, sensor 220 could be used to detect the presence of chemical species used for cleaning. If cleaning chemicals are found in a sufficient concentration, the actuator switch 214 can apply a reduced slit value sealing pressure.

In yet another alternative embodiment, vacuum processing chamber system 200 can signal the actuator switch 214 using a timer circuit (not shown). The timer circuit is synchronized at the start of wafer processing and configured to notify actuator switch 214 at the completion of one or more wafer processing steps. For example, if a chamber cleaning process is scheduled to begin after a 30 minute deposition process, timer circuit can send a signal to actuator switch 214 after 30 minutes. Accordingly, actuator switch 214 can then reduce the slit valve sealing pressure during the cleaning process. A delay in the timer circuit signal may be introduced to ensure the pressure in process chamber 204 has dropped to the lower pressure expected for the chamber cleaning process before the actuator switch 214 reduces the sealing pressure.

Figure 3:
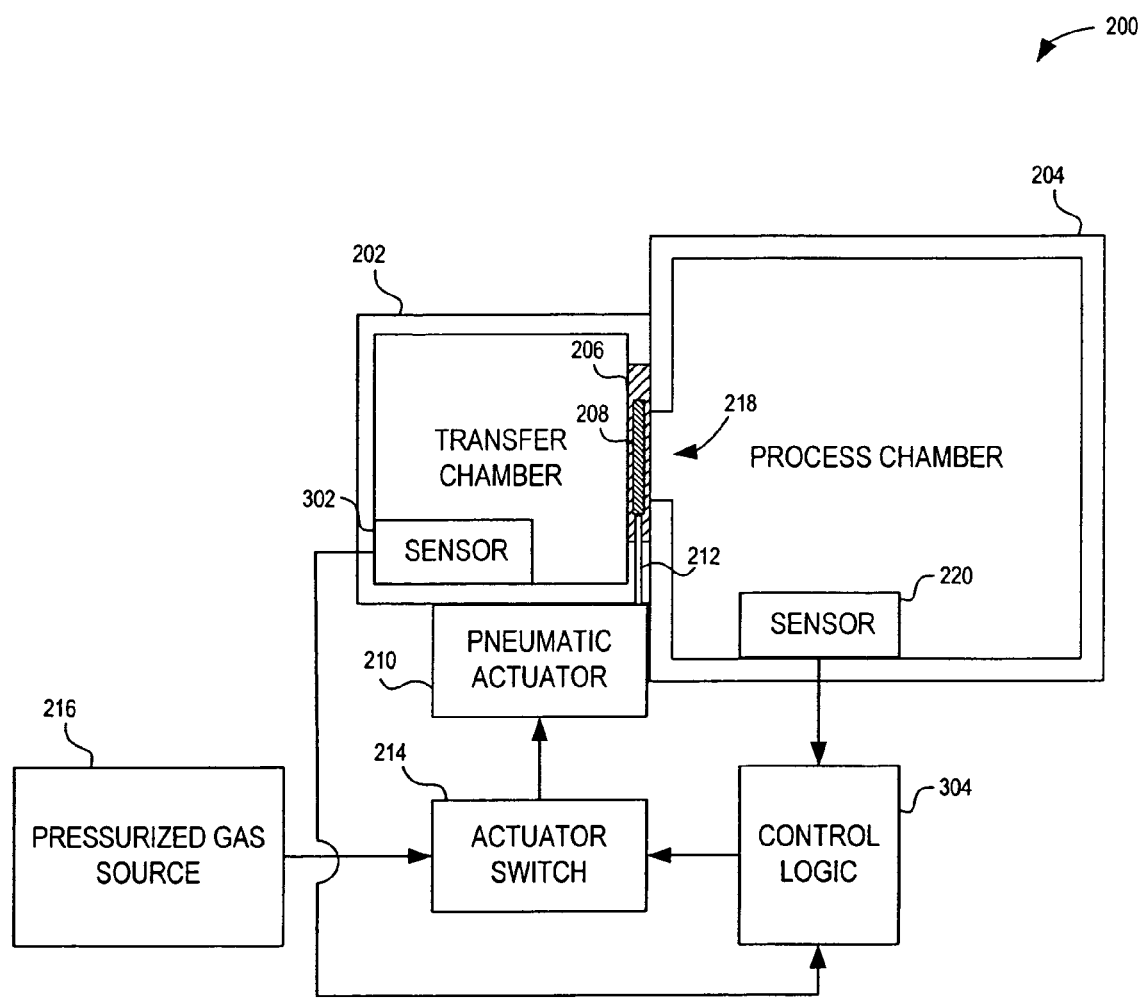
FIG. 3 is a simplified block diagram illustrating a second exemplary vacuum processing chamber system according to an embodiment of the present invention.

FIG. 3 is a simplified block diagram illustrating a second exemplary vacuum processing chamber system according to an embodiment of the present invention. Vacuum processing chamber system 200 includes a second sensor 302 to monitor the pressure in transfer chamber 202. In this implementation, the pressure gradient existing between the process chamber 204 and transfer chamber 202 can be calculated by control logic 304 as the difference from the measured values of sensor 118 and the second sensor 302. Control logic 304 can then direct actuator switch 214 to supply an appropriate pressure level to pneumatic actuator 210. Alternatively, a differential pressure switch can be used to monitor the pressure differences between transfer chamber 202 and process chamber 204. However, as transfer chamber 202 is typically maintained at about 0.3 torr during both the deposition process and chamber cleaning process, second sensor 302 may be unnecessary. Of course, even under such circumstances, second sensor 302 and the calculated pressure gradient can be used as a mechanism to verify pressure levels for improved accuracy, reliability, or safety.

Figure 4:
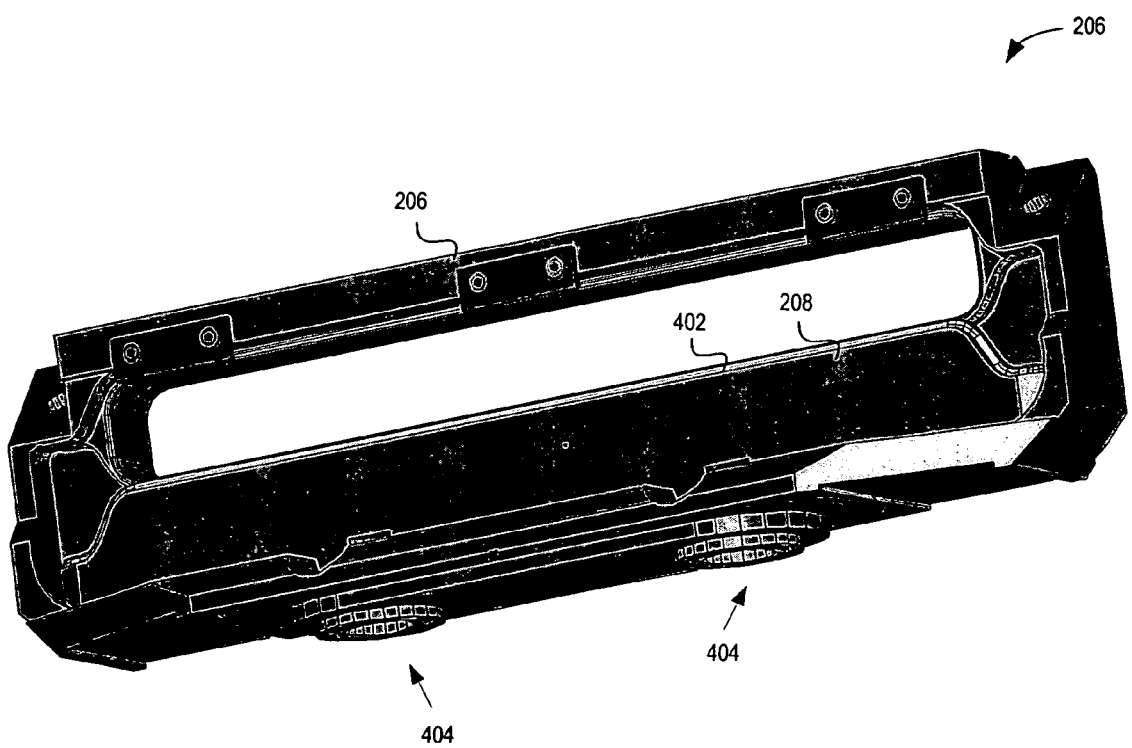
FIG. 4 is a front view of the slit valve and slit valve door according to an embodiment of the present invention.

FIG. 4 is a front view of slit valve 206 and slit valve door 208 according to an embodiment of the present invention. As illustrated in FIG. 4, sealing member 402 is attached to slit valve door 208. While in one embodiment, sealing member 402 is a perfluoro elastomeric o-ring, in other embodiments, sealing member 402 may be any suitable sealing device with elastic properties.

FIG. 4 also shows travel tubes 404. Travel tubes 404 allow rods 212 to pass through slit valve 206 and attach to slit valve door 208. Although two travel tubes 404 are depicted for two rods 212, one of ordinary skill will recognize that the present invention can use one, two, three, or more rods 212, and may accordingly required a corresponding number of travel tubes 404.

Figure 5:
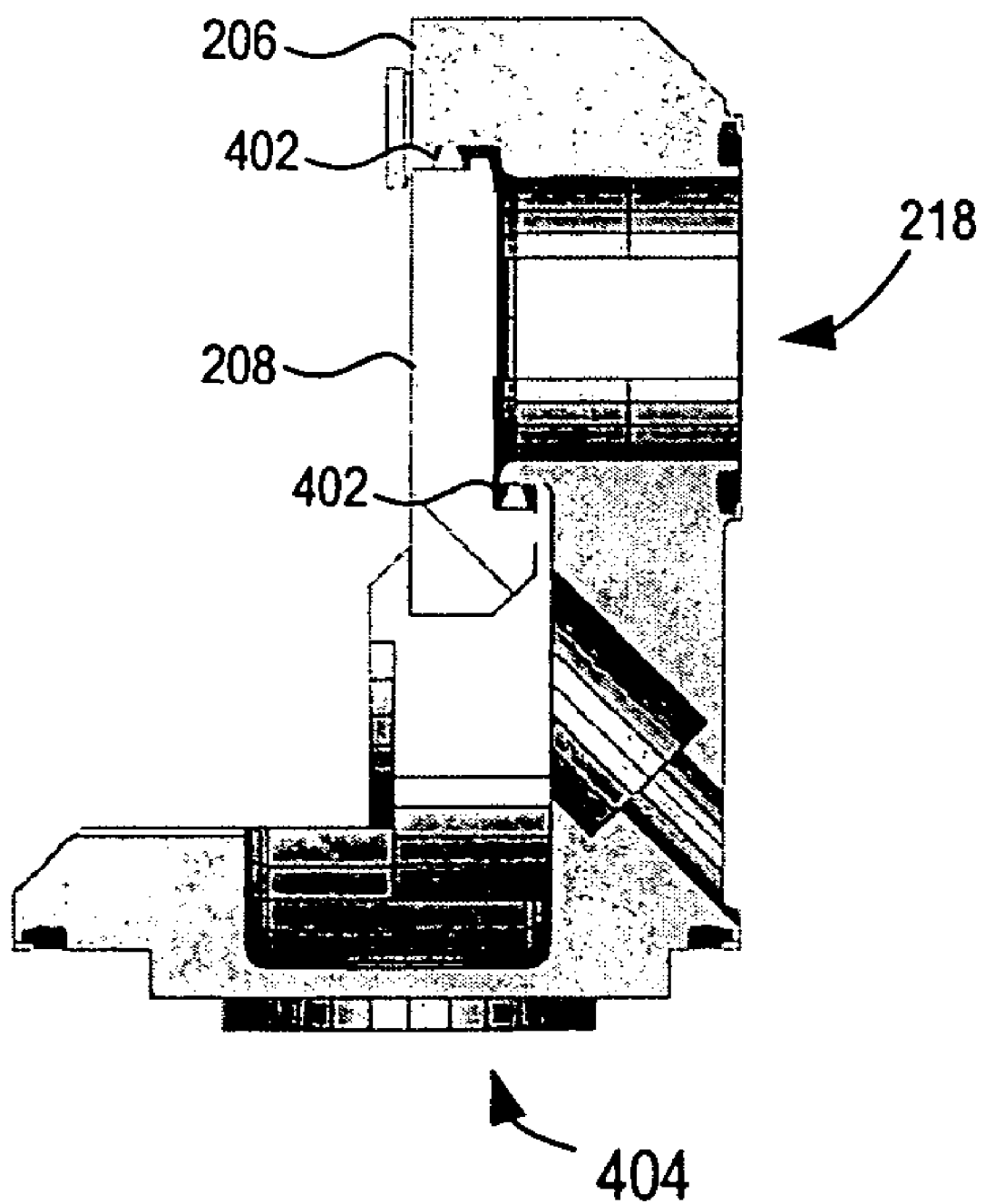
FIG. 5 is a cross-sectional side view of a slit valve according to an embodiment of the present invention.

FIG. 5 is a cross-sectional side view of slit valve 206. As shown FIG. 5, sealing member 402 surrounds the circumference of silt valve opening 218 to form a seal when slit. valve door 208 is in the closed position.

Figure 6A:
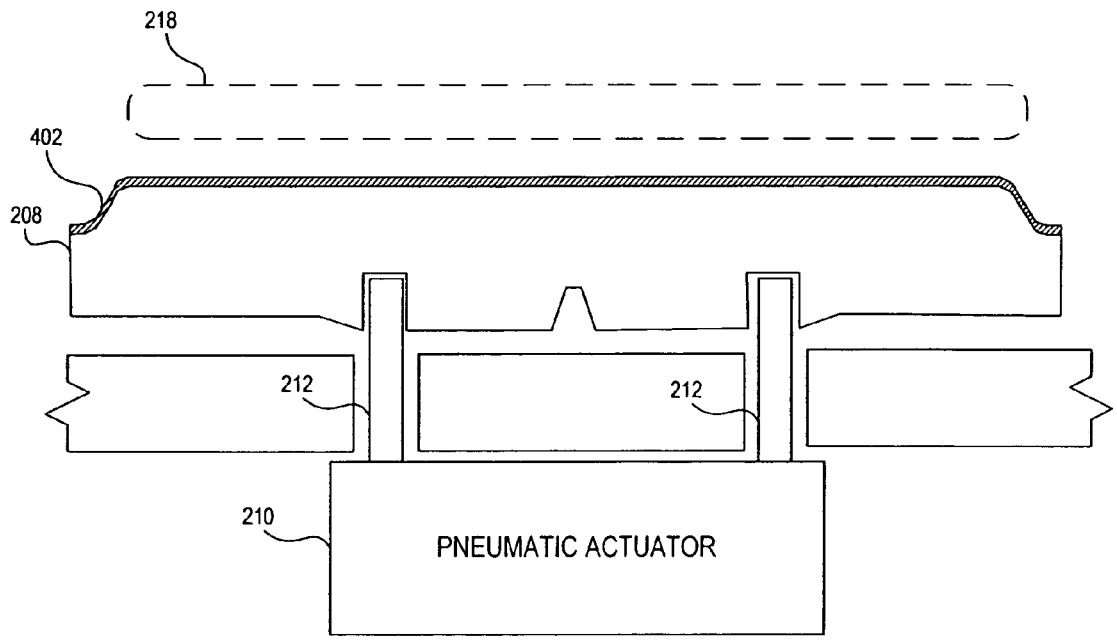
FIGS. 6(a) and 6(b) are simplified cross-sectional views of the actuator mechanism for the slit valve door according to an embodiment of the present invention in an open position and closed position, respectively.

FIG. 6(a) illustrates slit door 208 in an open position to allow substrates to pass between transfer chamber 202 to process chamber 204 through the slit valve opening 218.

Figure 6B:
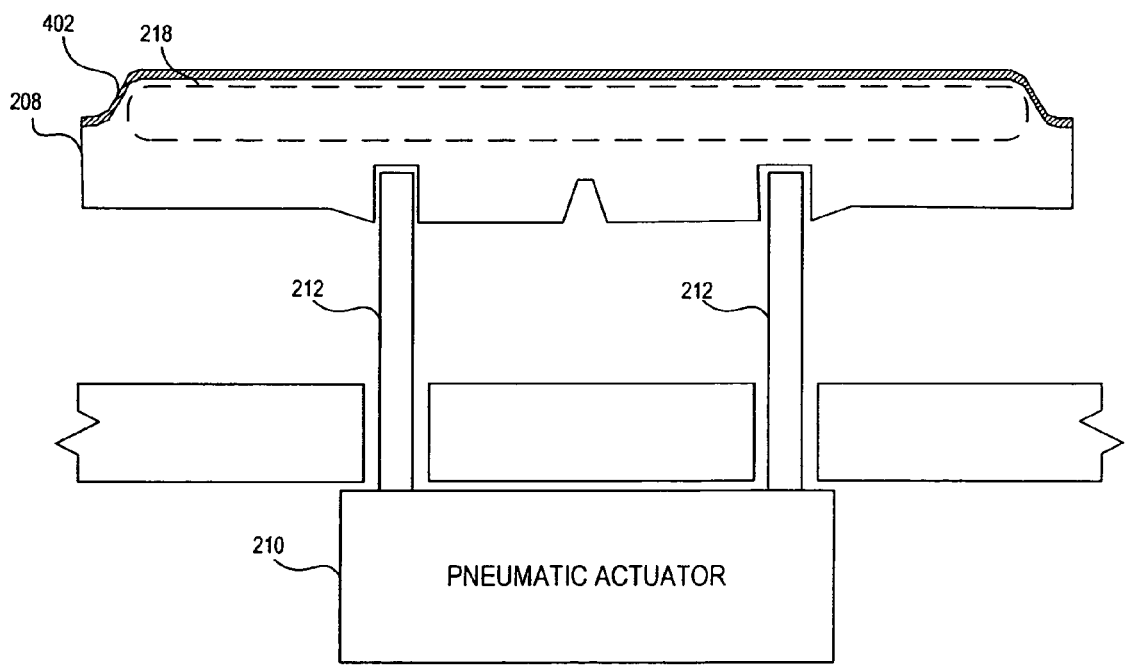

FIG. 6(b) illustrates slit door 208 in a closed position to seal transfer chamber 202 from process chamber 204. Rods 212, which pass through travel tubes 404, are attached to slit door 208. To close slit door 208, rods 212 are extended by pneumatic actuator 210.

Although specific embodiments of the invention have been described, various modifications, alterations, alternative constructions, and equivalents are also encompassed within the scope of the invention. The described invention is not restricted to operation within certain chamber processing environments, but is free to operate within a plurality of processing environments. Additionally, although the present invention has been described using a particular series of steps, it should be apparent to those skilled in the art that the scope of the present invention is not limited to the described series of steps.

Further, while the present invention has been described using a particular combination of hardware and software in the form of control logic and programming code and instructions, it should be recognized that other combinations of hardware and software are also within the scope of the present invention. Aspects of the present invention may be implemented only in hardware, or only in software, or using combinations thereof.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for sealing an opening between two chambers in a semiconductor processing device, the method comprising:
   providing a first chamber;
   providing a second chamber;
   providing a wall separating the first chamber from the second chamber, the opening extending circumferentially along an exterior surface of the wall;
   providing a slit door having an o-ring mounted along edges of the slit door, the slit door configured to move in a direction generally parallel to the exterior surface of the wall between an open position and a closed position, the opening allowing communication between the first chamber and the second chamber when the slit door is in the open position, and the opening being sealed when the slit door is in the closed position;
   moving the slit door from the open position to the closed position using an actuator;
   applying a first pressure to the slit door in the closed position using the actuator, the first pressure applied by the actuator in the direction generally parallel to the exterior surface of the wall; and
   applying a second pressure to the slit door in the closed position using the actuator, the second pressure applied by the actuator in the direction generally parallel to the exterior surface of the wall, wherein the first pressure is different than the second pressure, and the first pressure and the second pressure depend on a pressure gradient between the first chamber and the second chamber.

2. The method of claim 1 further comprising measuring a pressure inside the first chamber, the first pressure being based on the pressure.

3. The method of claim 1 further comprising calculating the pressure gradient based on pressure measurements taken inside the first chamber and inside the second chamber.

4. A method for sealing an opening between two regions in a semiconductor processing device, the method comprising:
   providing a first region;
   providing a second region;
   providing a wall separating the first region from the second region, the opening extending circumferentially along an exterior surface of the wall;
   providing a slit door having an o-ring mounted along an edge of the slit door, the slit door configured to seal the opening when in a closed position;
   positioning the slit door in the closed position;
   applying a first sealing pressure on the slit door in the closed position using an actuator, the first sealing pressure applied in a direction generally parallel to the exterior surface of the wall; thereafter
   forming a film on a substrate positioned in the first region;
   applying a second sealing pressure on the slit door in the closed position using the actuator, the second sealing pressure applied in the direction generally parallel to the exterior surface of the wall; and thereafter
   cleaning the first region;
   wherein the first sealing pressure is greater than the second sealing pressure.

5. The method of claim 4 wherein the first sealing pressure greater than the second sealing pressure by at least 25 psi.

6. The method of claim 4 further comprising measuring a pressure of the first region during cleaning, the second sealing pressure being based on the pressure.

7. The method of claim 4 wherein the applying the first sealing pressure and applying the second sealing pressure is automatically implemented by control logic.

8. The method of claim 1 wherein the o-ring surrounds a circumference of the opening when the slit door is in the closed position.

9. The method of claim 1 wherein the actuator is a pneumatic actuator.

10. The method of claim 1 further comprising detecting cleaning chemicals inside the first chamber, the second pressure being based on detection of the cleaning chemicals.

11. The method of claim 4 further comprising measuring a pressure of the first region during film formation, the first sealing pressure being based on the pressure.

12. The method of claim 4 further comprising measuring a pressure of the second region during film formation, the first sealing pressure being based on the pressure.

13. The method of claim 4 further comprising measuring a pressure of the second region during cleaning, the second sealing pressure being based on the pressure.

14. The method of claim 4 further comprising detecting cleaning chemicals inside the first region during cleaning, the second sealing pressure being based on detection of the cleaning chemicals.

* * * * *